United States Patent
Alfieri

(10) Patent No.: US 8,789,006 B2
(45) Date of Patent: Jul. 22, 2014

(54) SYSTEM, METHOD, AND COMPUTER PROGRAM PRODUCT FOR TESTING AN INTEGRATED CIRCUIT FROM A COMMAND LINE

(71) Applicant: NVIDIA Corporation, Santa Clara, CA (US)

(72) Inventor: Robert Alfieri, Chapel Hill, NC (US)

(73) Assignee: NVIDIA Corporation, Santa Clara, CA (US)

( * ) Notice: Subject to any disclaimer, the term of this patent is extended or adjusted under 35 U.S.C. 154(b) by 0 days.

(21) Appl. No.: 13/666,842

(22) Filed: Nov. 1, 2012

(65) Prior Publication Data

US 2014/0123090 A1    May 1, 2014

(51) Int. Cl.
*G06F 17/50* (2006.01)
(52) U.S. Cl.
USPC .......................................... 716/136
(58) Field of Classification Search
USPC .................................. 716/100, 136
See application file for complete search history.

(56) References Cited

U.S. PATENT DOCUMENTS

| | | | | |
|---|---|---|---|---|
| 5,604,895 A | * | 2/1997 | Raimi | 703/13 |
| 6,067,652 A | * | 5/2000 | Fusco et al. | 714/741 |
| 6,542,841 B1 | * | 4/2003 | Snyder | 702/104 |
| 7,184,917 B2 | * | 2/2007 | Pramanick et al. | 702/120 |
| 7,197,417 B2 | * | 3/2007 | Pramanick et al. | 702/119 |
| 7,209,851 B2 | * | 4/2007 | Singh et al. | 702/119 |
| 7,225,417 B2 | * | 5/2007 | Clarke et al. | 716/103 |
| 7,356,789 B2 | * | 4/2008 | Ly et al. | 716/108 |
| 7,712,062 B2 | * | 5/2010 | Ly et al. | 716/106 |
| 8,024,691 B2 | * | 9/2011 | Zilic et al. | 716/132 |
| 8,255,798 B2 | * | 8/2012 | Ording | 715/700 |
| 2002/0053045 A1 | * | 5/2002 | Gillenwater et al. | 714/38 |
| 2004/0019860 A1 | * | 1/2004 | Lee | 716/4 |
| 2005/0071125 A1 | * | 3/2005 | Groz | 702/186 |

* cited by examiner

*Primary Examiner* — Suchin Parihar
(74) *Attorney, Agent, or Firm* — Zilka-Kotab, PC

(57) ABSTRACT

A system, method, and computer program product are provided for testing a circuit representation. A command line input is received at a command line interface. The command line input is translated into one or more test conditions. Additionally, a test environment configured to simulate the circuit representation and verify the one or more test conditions is generated.

20 Claims, 4 Drawing Sheets

SYSTEM, METHOD, AND COMPUTER PROGRAM PRODUCT FOR TESTING AN INTEGRATED CIRCUIT FROM A COMMAND LINE

FIELD OF THE INVENTION

The present invention relates to integrated circuit simulation.

BACKGROUND

Applications are available that enable analog and digital circuits to be simulated and tested in software. SPICE (Simulation Program with Integrated Circuit Emphasis) is a well-known simulation program for testing analog circuits. Verilog and VHDL (Very-High-Speed Integrated Circuit Hardware Description Language) are well-known hardware description languages that are compatible with various simulators for testing digital circuits. Verification of code representing a circuit typically requires the construction of a dedicated test bench and specification of test vector stimulus by the circuit designer. When the circuit is a portion of logic within a larger unit, the construction of the dedicated test bench and specification of test vectors may occupy a significant amount of the circuit designer's time. Consequently, verification is sometimes performed only at the level of the larger unit.

There is thus a need for simplifying the circuit verification process for sub-circuits within larger units and/or addressing other issues associated with the prior art.

SUMMARY

A system, method, and computer program product are provided for testing a circuit representation. A command line input is received at a command line interface. The command line input is translated into one or more test conditions. Additionally, a test environment configured to simulate the circuit representation and verify the one or more test conditions is generated.

DETAILED DESCRIPTION

Figure 1:
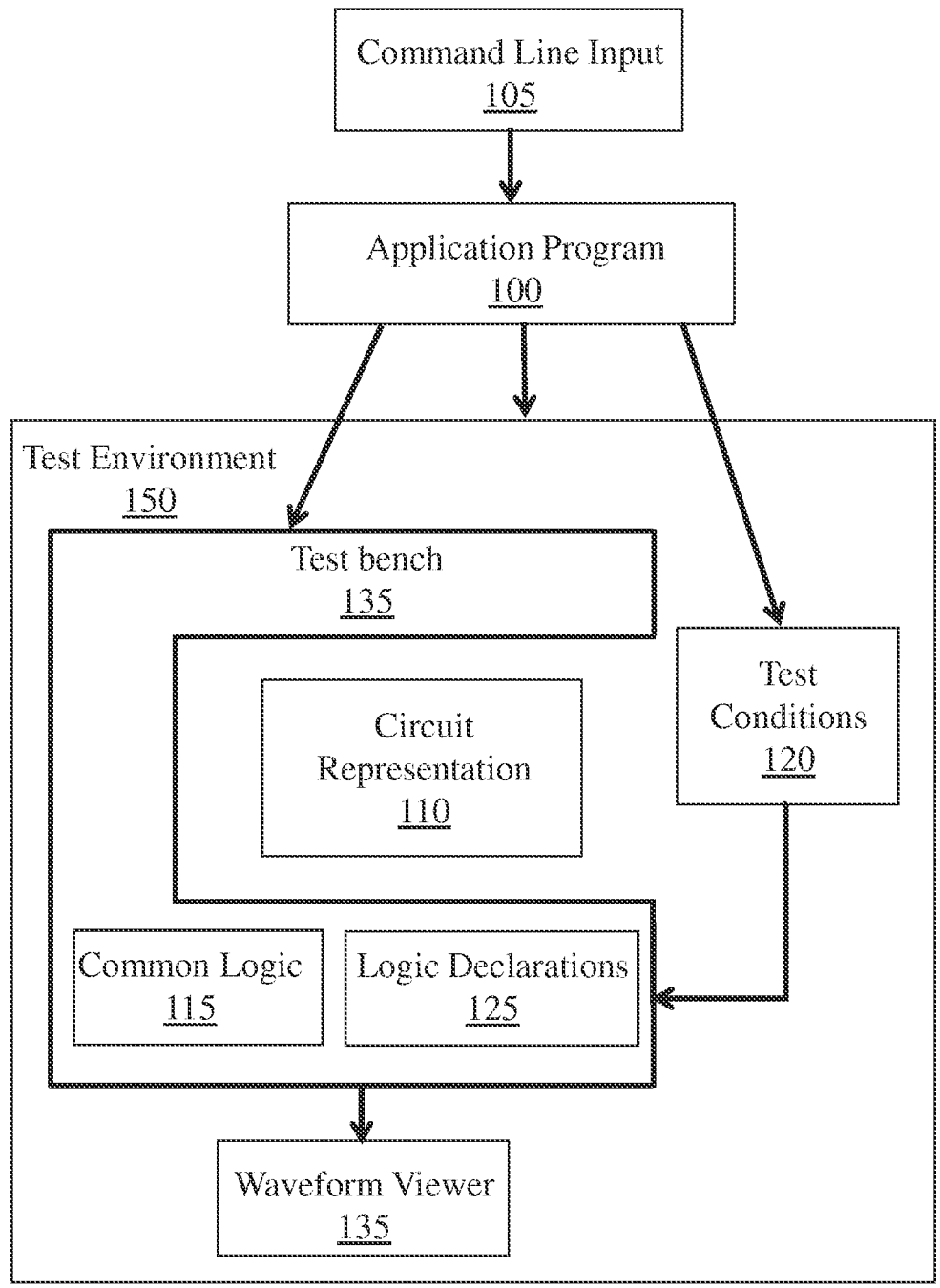
FIG. 1 shows a test environment generated by an application program according to a command line input, in accordance with one embodiment.

FIG. 1 shows test environment 150 generated by an application program 100 according to a command line input 105, in accordance with one embodiment. In one possible embodiment, the application program 100 may be a Vquiz application program. While a Vquiz application program is provided herein as an example of the application program 100, it should be strongly noted that such program is set forth for illustrative purposes only, and any application program may be employed to supplement and/or substitute for the same.

A circuit designer tests a circuit representation 110 by automatically generating a test environment 150 according to the command line input 105. The circuit representation 110 encodes functional behavior of various circuit elements including, but not limited to transistors, clock circuits, logic gates, registers, and/or any other circuit elements, for that matter. In one embodiment, the circuit representation 110 may specify input signals and output signals that are connected to the various circuit elements. For example, a circuit representation for a flip-flop logic device may specify a clock input signal, an input signal D, and an output signal Q connected to the flip-flop device.

Through the command line input 105, the circuit designer specifies one or more test conditions to verify during simulation of the circuit representation 110. As described further herein, the command line input 105 may be a text string comprising one or more test inputs, including, but not limited to a filename corresponding to the circuit representation 110, a filename to read that lists test inputs, an expression or assumption followed by one or more arguments (e.g., Boolean combinations of signals), one or more options (e.g., flags, switches, etc.), and/or any other test inputs, for that matter. In one embodiment, instead of being received via a command line, the input is received via a scripting language, such as the Perl programming language, and may be a simple function call or function call that may be used without arguments.

In one possible embodiment, a variety of different tests may be specified by the command line input 105. For example, the circuit designer may check whether input or output signals of the circuit representation 110 ever have a particular value during simulation or whether a specified Boolean combination of input and/output values occurs during simulation. In another example, the circuit designer may check whether particular input or output signals of the circuit representation 110 are an X (i.e., unknown, unassigned, or undefined) value during simulation. The circuit designer may also perform exhaustive checks of signal transitions during the simulation of the circuit representation 110 when the test environment 150 includes formal verification structures that are generated by the application program 100. In one embodiment, the application program 100 may be configured to open a waveform viewer 135 following simulation of the circuit representation 110 when the test fails or to display a particular event specified by a test condition.

The test environment 150 includes one or more of test conditions 120, a test bench 130, and a waveform viewer 135. The test conditions 120 are generated when the application program 100 translates assumptions and expressions specified by the command line input 105. In one embodiment, at least a portion of the assumptions and expressions are specified by files that are included as arguments within the command line input 105. The test bench 130 includes logic declarations 125 and common logic 115 that are generated by the application program 100 in response to the command line input 105. The common logic 115 may include a clock signal and clock gating circuitry that is used by all logic units that may instantiate the circuit representation 110. The logic declarations 125 are generated by the application program 100 based on counters and registers inferred from the command line input 105. In one embodiment, the circuit representation 110 is a 3 deep first-in first-out (FIFO) buffer. The following command line input 105 may be specified for testing the 3 deep FIFO buffer circuit representation 110:

vquiz -m fifo -assume '~wr_req'-always 'wr_idle' where fifo is the name of the FIFO buffer circuit representation 110 and wr_req is an input signal and wr_idle is an output signal of the FIFO buffer circuit representation 110. The -assume command is a constraint specified by the circuit designer. The -assume command specified by the command line input 105 verifies that the wr_idle (write idle) output signal is always asserted when the wr_req (write request) input signal is negated. The -assume command is translated into a first test condition of the test conditions 120 by the application program 100.

In another embodiment, the FIFO buffer circuit representation 110 does not include a wr_idle output signal and the following command line input 105 may be specified for testing that a rd_req signal (read request) is asserted and a wr_count signal (write count) and a rd_count signal (read count) are both zero when the wr_req input signal is negated for the 3 deep FIFO buffer circuit representation 110:

vquiz -m fifo -assume '~wr_req'\
-always 'rd_req && wr_count==0 && rd_count_p==0'.

The rd_req is an input signal and wr_count and rd_count_p are output signals of counters within the FIFO buffer circuit representation 110. In yet another embodiment, the FIFO buffer circuit representation 110 may be tested using a -never expression in place of the -always expression:

vquiz -m fifo -assume '—wr_req'-never 'rd_req||wr_count!=0||rd_count_p!=0'

In one embodiment, the application program 100 assumes that a clk input signal and a reset input signal of the FIFO buffer circuit representation 110 are clock and reset signals and generates the appropriate stimulus for the clock and reset in the test bench 130.

The circuit designer may want to test the FIFO buffer circuit representation 110 for signals having a value of X (i.e., unknown, unassigned, or undefined) instead being either asserted or negated (i.e., having a value of 1 or 0, respectively). The following command line input 105 may be specified:

vquiz -m fifo -xallowed wr_data '~wr_req'\
-xallowed rd_data '~rd_req'\
-never_xprop In one embodiment, by default all input signals of the circuit representation 110 are assumed to have a non-X value (i.e., known, assigned, or defined) and each output can never have a value of X (except during reset). The -never_xprop expression is used to check that X's are never propagated to outputs and, during simulation, each output is checked separately. The -xallowed expression may be used to allow input signals and output signals to have a value of X when certain Boolean expressions are true.

In the command line input 105 shown above, the first -xallowed expression specifies a first test condition that the wr_data (write data) input signal can have a value X when the wr_req input signal is negated. The second -xallowed expression specifies a second test condition that the rd_data (read data) input signal can have a value of X when the rd_req input signal is negated. The -never_xprop expression specifies to test each output signal of the FIFO buffer circuit representation 110 one at a time. By default the application program 100 identifies an output signal having a value of X as an error. All other inputs and outputs may be assumed by the application program 100 to be control signals and should never have values of X.

More illustrative information will now be set forth regarding various optional architectures and features with which the foregoing framework may or may not be implemented, per the desires of the user. It should be strongly noted that the following information is set forth for illustrative purposes and should not be construed as limiting in any manner. Any of the following features may be optionally incorporated with or without the exclusion of other features described.

Figure 2:
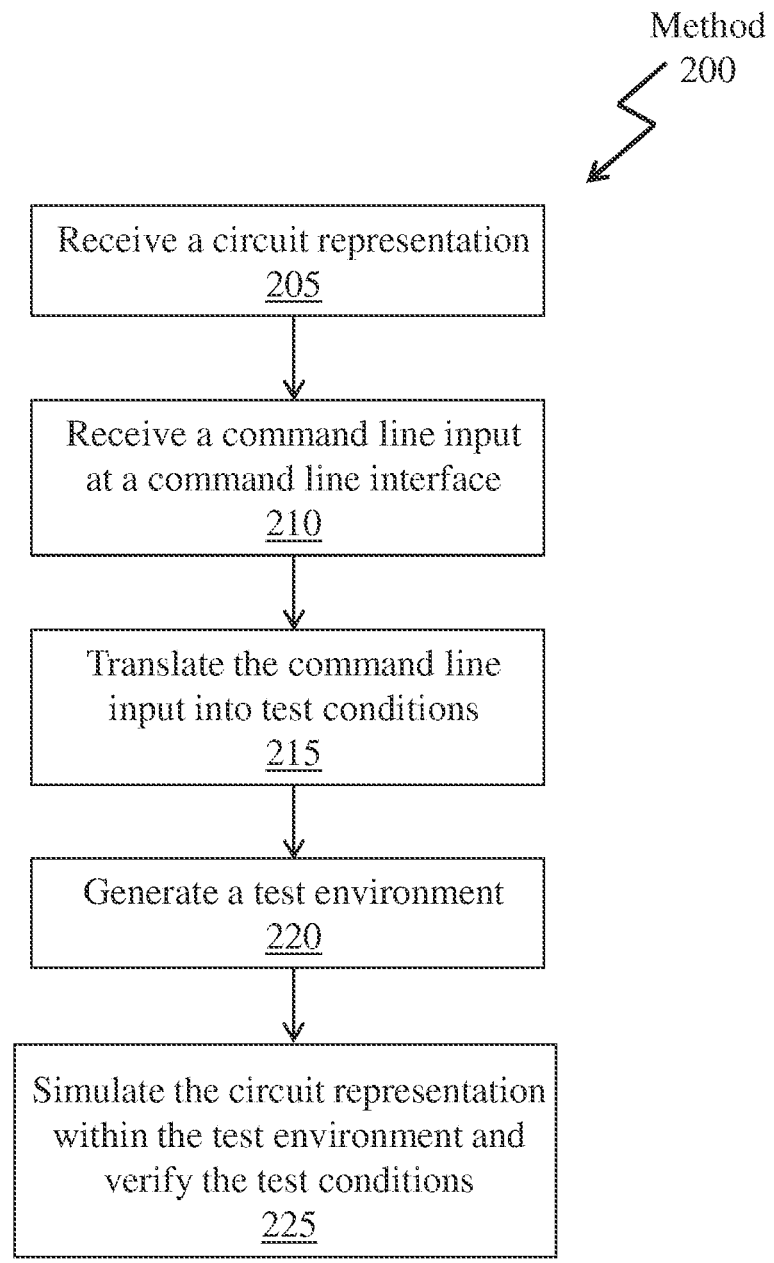
FIG. 2 illustrates a flowchart of a method for testing a circuit representation, in accordance with one embodiment.

FIG. 2 illustrates a flowchart of a method 200 for testing the circuit representation 110, in accordance with one embodiment. At step 205, the circuit representation 110 to be tested is provided to the application program 100. In one embodiment, the circuit representation 110 is written in the Verilog hardware description language. The name of the file encoding the circuit representation 100 may be provided as an argument within the command line input 105 or may be inferred based on an operating context. At step 210, the application program 100 receives one or more test inputs via the command line input 105 at a command line interface. The test inputs specify the circuit representation 110 and one or more assumptions and expressions, e.g., -assume, -always, -never, -cover, -xallowed, -never_xprop, and the like. The test inputs may also include repeat variables and delay variables that control the number of cycles a condition is applied to the circuit representation 110 and a number of cycles to delay a particular condition during testing, respectively.

At step 215, at least a portion of the test inputs received via the command line input 105 are translated into the test conditions 120 by the application program 100. At step 220, the test environment 150 is generated by the application program 100 according to the test inputs received via the command line input 105. At step 225, the application program 100 simulates the circuit representation 110 within the test environment 150 and verifies the test conditions.

As described further herein, the application program 100 generates the test bench 130 including the test conditions (.sva file). The application program 100 also generates a list of the inputs and outputs (.sig file) and a script (.sigs file) for use by the waveform viewer 135 to display the signal traces produced during simulation. Finally, the application program 100 generates the test environment 150 (.tcl file) instantiating the test bench 130 and the circuit representation 110. The test environment 150 may be a script that is executed to perform the simulation during step 225.

A circuit representation 110 of a valid/ready retiming flip-flop stage (pvld_prdy_retiming) may be implemented by the example Verilog HDL code shown in TABLE 1. The circuit representation 110 includes an output flip-flop and a skid register to implement a full valid/ready handshaking protocol. The example file shown in TABLE 1 is pvld_prdy_retiming.v.

TABLE 1

Valid/ready returning flip-flop circuit representation
module pvld_prdy_retiming (

```
  clk
, reset_
, idle
, pstage0_p_rdy
, pstage0_p_vld
, pstage0_p_dat
, out0_rdy
, out0_vld
, out0_dat
);
input clk;
input reset_;
output idle;
output pstage0_p_rdy;
input pstage0_p_vld;
input [31:0] pstage0_p_dat;
input out0_rdy;
output out0_vld;
output [31:0] out0]0_dat;
// for formal verification using vquiz:
assign idle = !pstage0_p_vld && !pstage0_skid_vld && !out0_vld;
// pstage0 full-registered pipe stage with bubble-collapsing skid
before output
reg out0_vld;
```

TABLE 1-continued

Valid/ready returning flip-flop circuit representation
module pvld_prdy_retiming (

```
reg [31:0] out0_dat;
reg pstage0_skid_vld;
reg [31:0] pstage0_skid_dat;
wire out0_held = out0_vld && !out0_rdy;
reg out0_held_d;
assign pstage0_p_rdy = !(pstage0_skid_vld && out0_held_d);
always @( posedge clk or negedge reset_ ) begin
    if ( !reset_ ) begin
        out0_vld <= 1'b0;
        out0_held_d <= 1'b0;
        pstage0_skid_vld <= 1'b0;
    end else begin
        out0_vld <= pstage0_p_vld || pstage0_skid_vld || out0_held;
        out0_held_d <= out0_held;
        pstage0_skid_vld <= (pstage0_p_vld || pstage0_skid_vld) &&
        out0_held;
    end
end
always @( posedge clk ) begin
    if ( (pstage0_p_vld || pstage0_skid_vld) && !out0_held ) begin
        out0_dat <= pstage0_skid_vld ? pstage0_skid_dat : pstage0_p_dat;
    end
    if ( pstage0_p_vld && pstage0_p_rdy && (pstage0_skid_vld ||
    out0_held) )
    begin
        pstage0_skid_dat <= pstage0_p_dat;
    end
end
endmodule
```

The circuit designer may provide a portion of the test inputs as a separate file (.vq file) such as that shown in TABLE 2. The .vq file may be read by the application program 100 when a command line input 105 is received that specifies the .vq file as an argument.

TABLE 2 test input file

```
# specify the circuit representation here
-m pvld_prdy_retiming
# for debugging, have data increment starting with 25
-counter pstage0_p_dat_next 25 'pstage0_p_vld && pstage0_p_rdy' 0
-assume 'pstage0_p_dat == pstage0_p_dat_next'
-counter out0_dat_next 25 'out0_vld && out0_rdy' 0
```

The first -counter expression is translated by the application program 100 into a logic declaration 125 of a counter called "pstage0_p_dat_next" in the test bench 130. The second -counter expression is translated by the application program 100 into a logic declaration 125 of a counter called "out0_dat_next" in the test bench 130. Both counters are initialized to 25 during reset, and are incremented and decremented according to the conditions specified following the -counter expression. For example, the pstage0_p_dat_next counter increments when pstage0_p_vld && pstage0_p_rdy (i.e., whenever a valid output is accepted by a receiver) and is not decremented. The -assume expression is translated to a test condition that verifies whether pstage0_p_dat_next equals the input data, e.g., pstage0_p_dat, which is applied to the circuit representation 110 during simulation.

In addition to -counter expressions, -register expressions may also be specified in the command line input 105 to generate logic declarations 125 in the test bench 130. The logic declarations 125 may generate signals during simulation that are used by one or more test conditions to verify specific functionality of the circuit representation 110.

In addition to translating expression and assumptions to generate the test conditions 120, the application program 100 parses the .v file shown in TABLE 1 and generates the following list of input and output signals that may be stored in a .sigs file:

clk 1 input
    idle 1 output
    out0_dat 32 output
    out0_held 1 internal
    out0_held_d 1 internal
    out0_rdy 1 input
    out0_vld 1 output
    pstage0_p_dat 32 input
    pstage0_p_rdy 1 output
    pstage0_p_vld 1 input
    pstage0_skid_dat 32 internal
    pstage0_skid_vld 1 internal
    reset_ 1 input The application program 100 uses the list of input and output signals to generate the test bench 130. The application program 100 may also generate a waveform viewer setup file (e.g., pvld_prdy_retiming_vquiz.sig) that lists the signals to be displayed by the waveform viewer 135.

As previously explained, the test bench 130 includes the logic declarations 125 and the common logic 115 according to the test inputs specified by the command line input 105. When the following command line input 105 is received, vquiz -e pvld_prdy_retiming.vq -always 'out0_vld|->
        out0_dat==out0_dat_next', the code shown in TABLE 3 that represents the test bench 130 is generated by the application program 100. The code representing the test bench 130 may be stored as an .sva file. Note that the file pvld_prdy_retiming.vq shown in TABLE 1 is provided as a test input in the command line input 105. Thus, the pvld_prdy_retiming.vq file is read by the application program 100 and the logic declarations (counters) are generated and the assumptions and expressions are translated into test conditions by the application program 100. Then the -always expression that is provided as a test input in the command line input 105 is translated into a test condition by the application program 100. The |-> operator following the -always expression is translated into a test condition that verifies that whenever out0_vld (out0 is valid), then out0_dat should equal out0_dat_next (the counter output) in the last clock cycle of the sequence.

TABLE 3

```
//
module pvld_prdy_retiming_vquiz (
    input clk                      /*input*/,
    input idle                     /*output*/,
    input [31:0] out0_dat          /*output*/,
    input out0_held                /*internal*/,
    input out0_held_d              /*internal*/,
    input out0_rdy                 /*input*/,
    input out0_vld                 /*output*/,
    input [31:0] pstage0_p_dat     /*input*/,
    input pstage0_p_rdy            /*output*/,
    input pstage0_p_vld            /*input*/,
    input [31:0] pstage0_skid_dat  /*internal*/,
    input pstage0_skid_vld         /*internal*/,
    input reset_                   /*input*/
);
// -counter generation
//
integer pstage0_p_dat_next;
always @( posedge clk or negedge reset_ ) begin
    if ( !reset_ ) begin
        pstage0_p_dat_next <= 25;
    end else begin
        pstage0_p_dat_next <= pstage0_p_dat_next + (pstage0_p_vld &&
pstage0_p_rdy) − (0);
```

TABLE 3-continued

```
  end
end
// -counter generation
//
integer out0_dat_next;
always @( posedge clk or negedge reset_) begin
   if ( !reset_ ) begin
      out0_dat_next <= 25;
   end else begin
      out0_dat_next <= out0_dat_next + (out0_vld && out0_rdy) - (0);
   end
end
// -assume translation into a test condition
//
property assumption0;
   @ ( posedge clk ) disable iff( !reset_ )
      (pstage0_p_dat == pstage0_p_dat_next);
endproperty
Assumption0: assume property( assumption0 );
// -always translation into a test condition
//
property quiz0;
   @( posedge clk ) disable iff( !reset_ )
      (out0_vld |-> out0_dat == out0_dat_next);
endproperty
Quiz0: assert property( quiz0 );
endmodule // pvld_prdy_retiming_vquiz
```

The circuit representation 110 and the generated test bench 130 are instantiated in the test environment 150, and the application program 100 simulates the test environment 150 to test the circuit representation 110. A script representing the test environment 150 is shown in TABLE 4.

TABLE 4

Generated test environment

```
# pvld_prdy_retiming - vquiz script

analyze +define+SYNTHESIS +define+ASSERT_ON +define+
FV_ASSERT_ON
+define+FV_SVA_ON +libext+.vlib -y . -v vquiz_common.v -sv
{./pvld_prdy_retiming.v}
analyze -sv ./pvld_prdy_retiming_vquiz.sva
elaborate -bboxa 10000000 -top pvld_prdy_retiming
connect -bind pvld_prdy_retiming_vquiz pvld_prdy_retiming_vquiz
-auto -elaborate
set_trace_show_reset 1
clock clk
reset !reset_
set success [prove -property pvld_prdy_retiming.pvld_prdy_
retiming_vquiz.Quiz0 -
time_limit 7200]
if {$success != "proven" } {
   if {$success == "time_limit"} {
      exit 2
   }
   trace -property pvld_prdy_retiming.pvld_prdy_retiming_
   vquiz.Quiz0 -sig_order
pvld_prdy_retiming_vquiz. sig
   puts "Hit any key to leave test"
   gets stdin
   exit 1
}
exit 0
```

The circuit designer may specify a different test for the circuit description 110 shown in TABLE 1 by providing a different command line input 105. For example, the following command line input 105 may be provided to the application program 100:

```
vquiz -e pvld_prdy_retiming.vq\
-xallowed pstage0_p_dat'~pstage0_p_vld'\
-xallowed out0_dat '~out0_vld'\
-never_xprop
```

In response to receiving the command line input 105 shown above, the application program 100 generates the test bench 130 that includes the logic declarations 125 and the common logic 115 according to the test inputs specified by the command line input 105. Specifically, the test bench 130 shown in TABLE 5 is generated by the application program 100. Note that the file pvld_prdy_retiming.vq shown in TABLE 1 is provided as test input in the command line input 105. Thus, the pvld_prdy_retiming.vq file is read by the application program 100 and the logic declarations (counters) are generated and the assumptions and expressions are translated into test conditions by the application program 100. Then the -xallowed expressions and -never expression that are provided as a test inputs along with the pvld_prdy_retiming.vq file in the command line input 105 are translated by the application program 100 into test conditions that appear in the script code representing the test environment 150 shown in TABLE 7.

TABLE 5

```
module pvld_prdy_retiming_vquiz (
   input clk                        /*input*/,
   input idle                       /*output*/,
   input [31:0] out0_dat            /*output*/,
   input out0_held                  /*internal*/,
   input out0_held_d                /*internal*/,
   input out0_rdy                   /*input*/,
   input out0_vld                   /*output*/,
   input [31:0] pstage0_p_dat       /*input*/,
   input pstage0_p_rdy              /*output*/,
   input pstage0_p_vld              /*input*/,
   input [31:0] pstage0_skid_dat    /*internal*/,
   input pstage0_skid_vld           /*internal*/,
   input reset_                     /*input*/
);
// -counter generation
//
integer pstage0_p_dat_next;
always @( posedge clk or negedge reset_ ) begin
   if ( !reset_ ) begin
      pstage0_p_dat_next <= 25;
   end else begin
      pstage0_p_dat_next <= pstage0_p_dat_next + (pstage0_p_vld &&
pstage0_p_rdy) - (0);
   end
end
// -counter generation
//
integer out0_dat_next;
always @( posedge clk or negedge reset_ ) begin
   if ( !reset_ ) begin
      out0_dat_next <= 25;
   end else begin
      out0_dat_next <= out0_dat_next + (out0_vld && out0_rdy) - (0);
   end
end
// -assume translation into a test condition
//
property assumption0;
   @( posedge clk ) disable iff( !reset_ )
      (pstage0_p_dat == pstage0_p_dat_next);
endproperty
Assumption0: assume property( assumption0 );
endmodule // pvld_prdy_retiming_vquiz
```

The circuit representation 110 and the generated test bench 130 shown in TABLE 5 are instantiated by the test environment 150 and the application program 100 simulates the test environment 150 to test the circuit representation 110. A script representing the test environment 150 is shown in TABLE 6.

TABLE 6

Generated test environment

```
# pvld_prdy_retiming – vquiz script

analyze +define+SYNTHESIS +define+ASSERT_ON
+define+FV_ASSERT_ON +define+FV_SVA_ON +libext+
.vlib –y . –v
vquiz_common.v –sv {./pvld_prdy_retiming.v}
analyze –sv ./pvld_prdy_retiming_vquiz.sva
elaborate –xHandling –bboxa 10000000 –top pvld_prdy_retiming
connect –bind pvld_prdy_retiming_vquiz pvld_prdy_retiming_
vquiz –auto –
elaborate
set_trace_show_reset 1
clock clk
reset !reset_
assume –xprop –to pstage0_p_dat –precond ~(~pstage0_p_vld)
assert –name idle_xprop –xprop –from pstage0_p_dat –to idle
set success [prove –property idle_xprop –time_limit 7200]
if {$success != "proven" } {
    if {$success == "time_limit"} {
        exit 2
    }
    trace –property idle_xprop –sig_order pvld_prdy_retiming_vquiz.sig
    puts "Hit any key to leave test"
    gets stdin
    exit 1
}
assert –name out0_dat_xprop –xprop –from pstage0_p_dat –to
out0_dat –precond
~(~out0_vld)
set success [prove –property out0_dat_xprop –time_limit 7200]
if {$success != "proven" } {
    if {$ success == "time_limit" }
        exit 2
    }
    trace –property out0_dat_xprop –sig_order pvld_prdy_
    retiming_vquiz.sig
    puts "Hit any key to leave test"
    gets stdin
    exit 1
}
assert –name out0_vld_xprop –xprop –from pstage0_p_dat –to out0_vld
set success [prove –property out0_vld_xprop –time_limit 7200]
if {$success != "proven" } {
    if {$ success == "time_limit"} {
        exit 2
    }
    trace –property out0_vld_xprop –sig_order pvld_prdy_
    retiming_vquiz.sig
    puts "Hit any key to leave test"
    gets stdin
    exit 1
}
assert –name pstage0_p_rdy_xprop –xprop –from pstage0_p_dat –to
pstage0_p_rdy
set success [prove –property pstage0_p_rdy_xprop –time_limit 7200]
if {$success != "proven"} {
    if {$ success == "time_limit"} {
        exit 2
    }
    trace –property pstage0_p_rdy_xprop –sig_order pvld_prdy_
    retiming_vquiz.sig
    puts "Hit any key to leave test"
    gets stdin
    exit 1
}
exit 0
```

Note that the test inputs provided in the command line input 105 related to X value propagation (e.g., -xallowed pstage0_p_dat '-pstage0_p_vld', -xallowed out0_dat '~out0_vld', and -never_xprop) are translated into test conditions in the test environment 150. Specifically, the first -xallowed expression is translated into the following test condition shown in TABLE 6 that allows the input data (e.g., pstage0_p_dat) to have a value of X when the corresponding valid signal (e.g., pstage0_p_vld) is negated. The second -xallowed expression that specifies X is allowed for the out0_dat output when out0_vld is negated is translated into assert -name out0_dat_xprop -xprop -from pstage0_p_dat -to out0_dat -precond ~(~out0_vld).

assume -xprop -to pstage0_p_dat -precond ~(~pstage0_p_vld)

The -never_xprop expression is translated into the following four test conditions (shown in TABLE 6) that disallow any inputs or outputs to have a value of X (other than the exceptions provided by the -xallowed expressions):

assert -name idle_xprop -xprop -from pstage0_p_dat -to idle assert -name out0_dat_xprop -xprop -from pstage0_p_dat -to out0_dat -precond ~(~out0_vld)

assert -name out0_vld_xprop -xprop -from pstage0_p_dat -to out0_vld assert -name pstage0_p_rdy_xprop -xprop -from pstage0_p_dat -to pstage0_p_rdy In addition to specifying common logic and logic declarations and translating assumptions and expressions into test conditions, the test inputs provided via the command line input 105 can also specify that a particular signal transition be covered by the test. Returning to the 3 deep FIFO example described earlier, the following command line input 105 causes the test to "cover" a particular test condition of the internal wr_count counter within the FIFO buffer circuit representation 110 having a value of 3, indicating that the FIFO buffer is full, for at least one clock cycle during simulation:

vquiz -m fifo -cover 'wr_count==3'.

The application program 100 may be configured to bring up the waveform viewer 135, e.g., a graphics user interface, illustrating a point in time during the simulation when the wr_count counter equals 3. If the application program 100 cannot find a case in which the wr_count counter equals 3, then the application program 100 reports a failure because the test condition is not met (i.e., is not covered).

The test inputs provided at the command line input 105 may also specify delays for a particular signal having a value relative to a Boolean combination of one or more signals having particular values. Again, referring to the 3 deep FIFO buffer example, the following command line input 105 specifies covering the test condition when both wr_reg is asserted and wr_data has a value of 254 occurs one clock cycle before rd_req is asserted. In other words, the test condition indicates when rd_req=1 is delayed by one clock cycle relative to wr_req=1 and wr_data==254:

vquiz -m fifo -cover 'wr_req && wr_data==254 ##1 rd_req'

Because a minimum of 2 cycles are needed for data written to the fifo to reach the output of the fifo, the wr_req will need to be asserted for 2 clock cycles in a row, before the condition of rd_req being asserted is met, ensuring that the test condition is covered.

In order to specify that the rd_req should be asserted 2 clock cycles after wr_req is asserted and wr_data is 254 (i.e., after 254 is pushed into the FIFO buffer) the following command line input 105 may be provided:

vquiz -m fifo -cover 'wr_req && wr_data==254 ##2 rd_req'

Note that the wr_req only needs to be asserted for one clock cycle so that the condition of rd_req being asserted two clock cycles later is met, ensuring that the test condition is covered.

To force wr_req to be de-asserted (i.e., negated) before rd_req is asserted, the following command line input 105 may be provided:

vquiz -m fifo -cover 'wr_req && wr_data==254 ##1~wr_req ##1 rd_req' wr_req is asserted for a first clock cycle and is negated for a second clock cycle. If, on a third clock cycle, the condition of rd_req being asserted is met, then the test condition is covered.

In another example, it is possible to test if rd_req is asserted 1-3 cycles after wr_req is asserted and wr_data is 254. The following command line input 105 may be provided:

vquiz -m fifo -cover 'wr_req && wr_data==254 ##[1:3] rd_req'

Most, likely the test condition would be considered to be covered by the application program 100 when rd_req is asserted 2 clock cycles after wr_req. The [1:3] may be replaced with [1:$] to specify the condition of rd_req begin asserted at least 1 clock cycle after wr_req is asserted and wr_data is 254.

Another technique for specifying test conditions is to use $past(wr_data) to obtain the previous clock cycle's value of wr_data and increment/decrement the value to generate different data for input to the FIFO buffer each clock cycle. The following command line input 105 may be used:

vquiz -m fifo -cover 'wr_req && wr_data==($past (wr_data)−1)##[1:$] rd_req'

Yet another example command line input 105 may be used to cover a test condition where at first the FIFO buffer is filled and the read output (pop) is stalled, then the FIFO buffer entries are read (popped). The following command line input 105 may be used to test such a case:

vquiz -m fifo -cover 'wr_req &&~wr_busy && wr_data==($past(wr_data)+1) && rd_busy [*5] ##1~wr_req &&~rd_busy [*5] ##1~rd_req'

The Boolean combination of signal values following the -cover expression is repeated for 5 clock cycles ([*5]). rd_busy is asserted while incrementing values are pushed into the FIFO buffer. $past(wr_data) returns the value of wr_data from the previous clock cycle. $past(wr_data, 2) would return the value of wr_data from 2 clock cycles earlier. After the 5 clock cycles, rd_busy is negated and the test condition that is covered is rd_req being negated 5 clock cycles after rd_busy is negated. When the test condition is met, the test is covered.

A different test that checks for rd_req being negated on the sixth clock cycle of the FIFO buffer emptying (via pops) may be specified using the following command line input 105:

vquiz -m fifo -always '(wr_req &&~wr_busy && wr_data==($past(wr_data_+1) && rd_busy [*5] ##1~wr_req &&~rd_busy [*6])|->~rd_req'

As previously explained, the |-> operator is used so that when the Boolean combination of signal values in parenthesis to the left of the |-> operator occurs, then the ~rd_req should occur in the last clock cycle of the sequence. If the |=> operator is used then the ~rd_req should occur in the cycle following the last clock cycle of the sequence.

The -counter expression that is translated by the vquiz application program 100 into a logic declaration 125 may be used to test that all of the data pushed into the FIFO buffer are popped from the FIFO buffer. For example, the following command line input 105 may be used:

vquiz -m fifo -counter outstanding 0 'wr_req &&~wr_busy' 'rd_req &&~rd_busy'\-always '(wr_idle &&~wr_req)|-> outstanding==0'

The -counter expression creates a logic declaration 125 for a counter called outstanding that is initialized to 0 during reset. The outstanding counter is initialized to 0, incremented whenever data is pushed into the FIFO buffer, and is decremented whenever data is popped from the FIFO buffer. The command line input 105 tests that the outstanding counter equals 0 whenever the FIFO buffer is idle and no new input has been received.

The same test could also be performed using the following command line input 105:

vquiz -m fifo -counter outstanding 0 'wr_req &&~wr_busy' 'rd_req &&~rd_busy'\-never '(wr_idle &&~wr_req && outstanding !=0'

A -counter expression may also be used to test that the correct data is popped from the FIFO buffer, even if the output is stalled for one or more clock cycles. A counter (wr_data_next) can be initialized to 25 and then incremented based on an expression (wr_req &&—wr_busy). For example, the following .vq file may be provided:

vquiz -m fifo
-counter wr_data_next 25 'wr_req &&~wr_busy' 0
-assume 'wr_data==wr_data_next'
-counter rd_data_next 25 'rd_req &&~rd_busy' 0

The counter wr_data_next is never decremented because the decrement argument for the -counter expression is 0. The wr_data_next counter provides an incrementing value for input to the FIFO buffer (wr_data). Similarly, the rd_data_next counter is incremented and never decremented. The following command line input 105 may then be used to test that the correct data is popped from the FIFO buffer.

vquiz -e fifo.vq -always 'rd_req|-> rd_data==rd_data_next'

The simulation may take a long time to run and never finish. However, if the test condition fails, the simulation will finish quickly. A time limit of 5 minutes may be specified for the simulation by providing the following command line input 105:

vquiz -e fifo.vq -always 'rd_req|-> rd_data==rd_data_next'-time_limit 5m

Time limits may also be specified in seconds (s), days (d), and hour (h). In one embodiment, when a simulation exceeds the time limit specified for a test condition, the application program 100 will print "TIMED_OUT" and stop.

Finally, the same test may be specified by providing the following command line input 105 without using the |-> operator:

vquiz -e fifo.vq -never 'rd_req && rd_data !=rd_data_next'-time_limit 5m

In sum, the following expressions may be translated into test conditions by the application program 100: -assume, -cover, -always, -never, -time_limit, -never_xprop, -xallowed. The following expressions may be translated into logic declarations by the application program 100: -counter and -reg (register). Specifically, in one embodiment, the -counter expression produces a logic declaration of a 32-bit integer counter and the -reg expression produces a logic declaration of a signed 32-bit integer counter. The -extra expression may be translated into additional logic that may be used by an -assume, -always, or -never expression.

Figure 3:
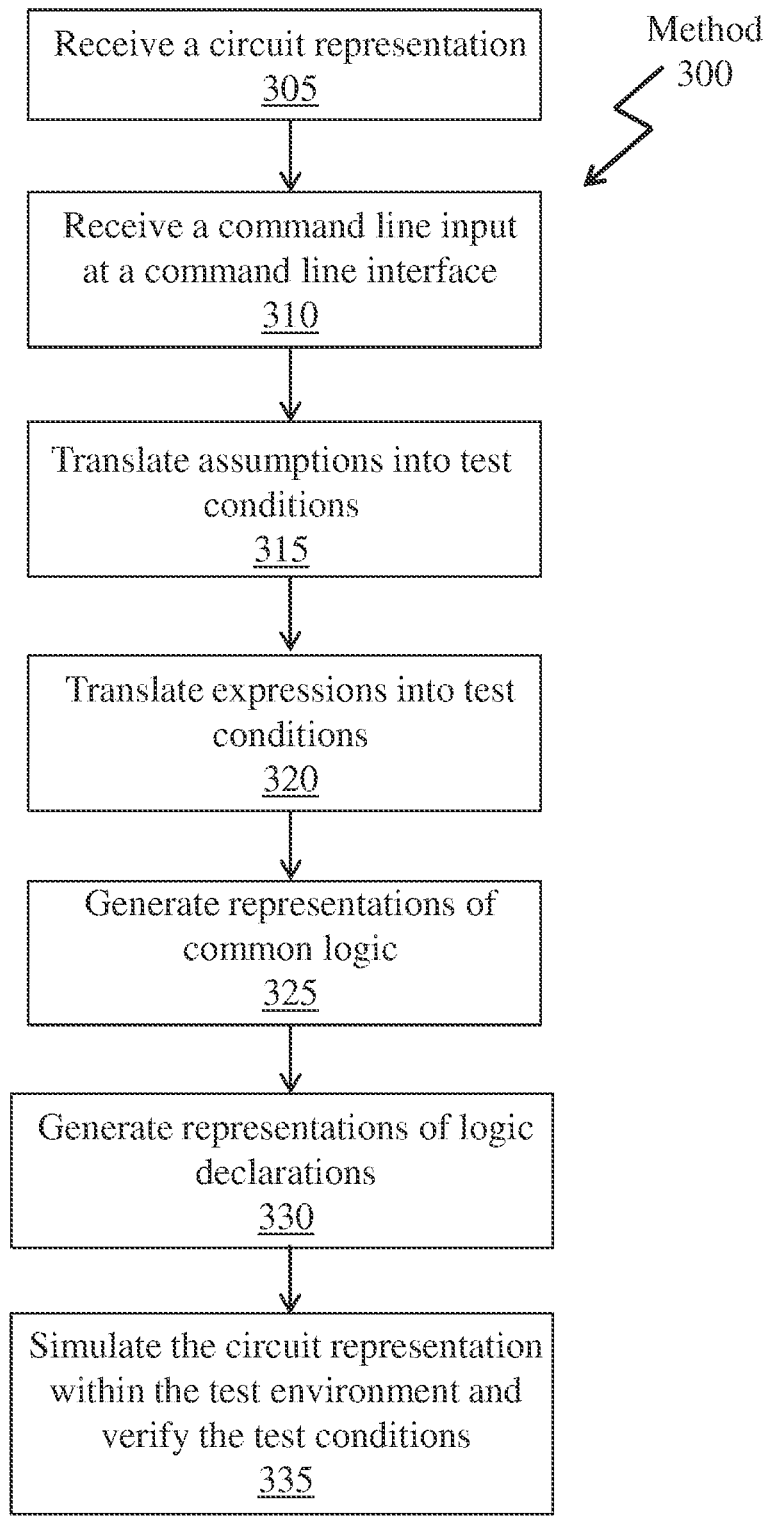
FIG. 3 illustrates a flowchart of another method for testing a circuit representation, in accordance with one embodiment.

FIG. 3 illustrates a flowchart of a method 300 for testing the circuit representation 110, in accordance with one embodiment. At step 305, the circuit representation 110 to be tested is provided to the application program 100. At step 310, the application program 100 receives one or more test inputs via the command line input 105 at a command line interface. At step 315, the application program 100 translates the assumptions (-assume expressions) into test conditions. A particular assumption specified by the command line input 105 is translated into a command that, when executed, verifies a first test condition corresponding to the assumption.

At step 320, the application program 100 translates the expressions (-cover, -always, -never, -time_limit, -never_xprop, and -xallowed) into test conditions. A particular expression specified by the command line input 105 is translated into a command that, when executed, verifies a first test condition corresponding to the expression. When a -xallowed unknown value propagation expression is specified by the command line input 105, the expression is translated into a command that, when executed, allows at least one signal to have an unknown value during simulation of the circuit representation 110. When -never_xprop unknown value propagation expression is specified by the command line input 105, the expression is translated into a command that, when executed, requires input and output signals (except those signals specified by the -xallowed expression) to have known values during simulation of the circuit representation 110.

At step 325, the application program 100 generates representations of common logic 115 and logic specified by the -extra expression. At step 330, the application program 100 generates representations of logic declarations 125. The common logic 115, logic declarations 125, and test conditions 120 may be incorporated into the test bench 135. At step 225, the application program 100 simulates the circuit representation 110 within the test environment 150 and verifies the test conditions.

As described further herein, the application program 100 generates the test bench 130 including the test conditions (.sva file). The application program 100 also generates a list of the inputs and outputs (.sig file) and a script (.sigs file) for use by the waveform viewer 135 to display the signal traces produced during simulation. Finally, the application program 100 generates the test environment 150 (.tcl file) instantiating the test bench 130 and the circuit representation 110. The test environment 150 may be a script that is executed to perform the simulation during step 225.

Figure 4:
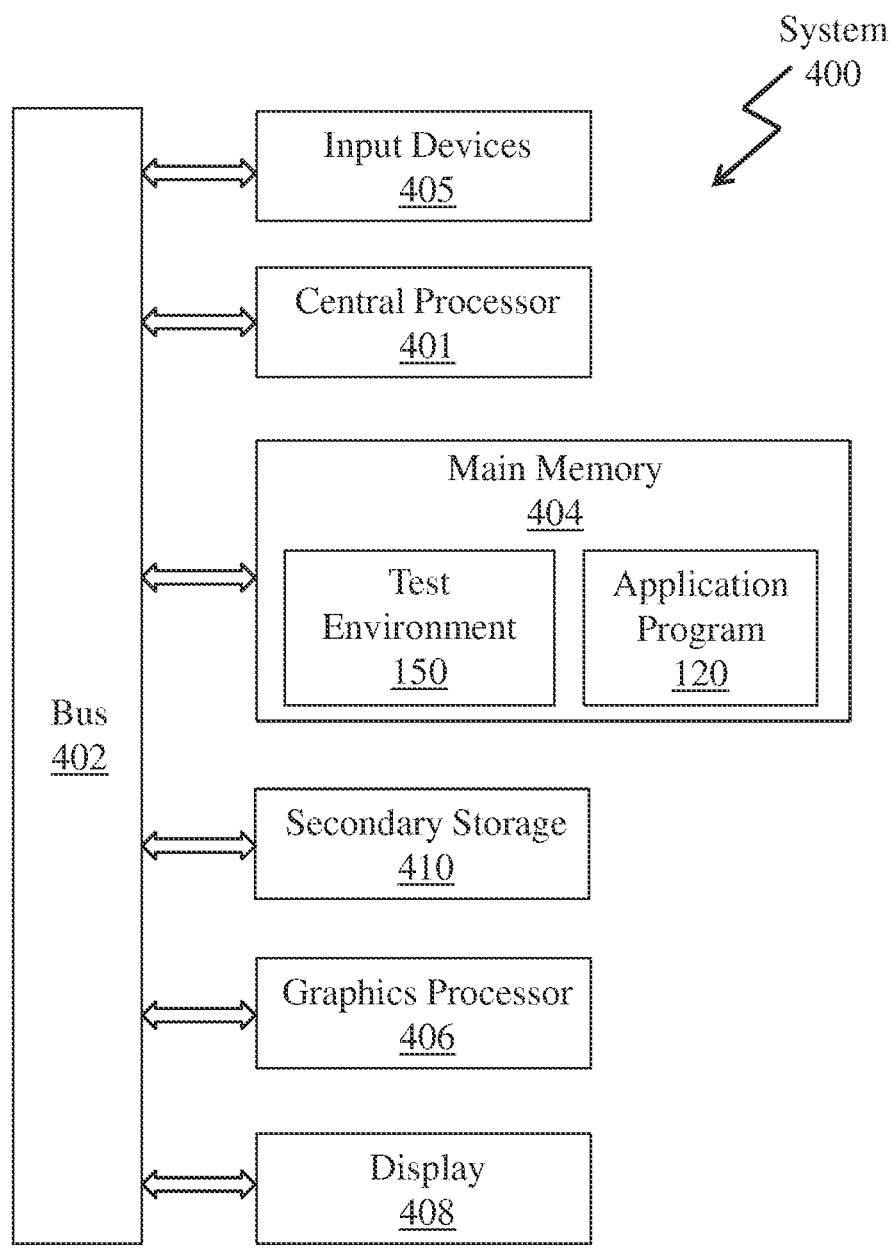
FIG. 4 illustrates an exemplary system in which the various architecture and/or functionality of the various previous embodiments may be implemented.

FIG. 4 illustrates an exemplary system 400 in which the various architecture and/or functionality of the various previous embodiments may be implemented. As shown, a system 400 is provided including at least one central processor 401 that is connected to a communication bus 402. The communication bus may be implemented using any suitable protocol, such as PCI (Peripheral Component Interconnect), PCI-Express, AGP (Accelerated Graphics Port), HyperTransport, or any other bus or point-to-point communication protocol(s). The system 400 also includes a main memory 404. Control logic (software) and data are stored in the main memory 404 which may take the form of random access memory (RAM). In particular, the application program 100 and the test environment 150 may be stored in the main memory 404. As an option, the present system 400 may be implemented to carry out the method 200 of FIG. 2.

The system 400 also includes input devices 410, a graphics processor 406, and a display 408, i.e. a conventional CRT (cathode ray tube), LCD (liquid crystal display), LED (light emitting diode), plasma display or the like. User input may be received from the input devices 410, e.g., keyboard, mouse, touchpad, microphone, and the like. For example, a circuit designer may provide the command line input 105 via the input devices 410. In one embodiment, the graphics processor 406 may include a plurality of shader modules, a rasterization module, etc. Each of the foregoing modules may even be situated on a single semiconductor platform to form a graphics processing unit (GPU).

In the present description, a single semiconductor platform may refer to a sole unitary semiconductor-based integrated circuit or chip. It should be noted that the term single semiconductor platform may also refer to multi-chip modules with increased connectivity which simulate on-chip operation, and make substantial improvements over utilizing a conventional central processing unit (CPU) and bus implementation. Of course, the various modules may also be situated separately or in various combinations of semiconductor platforms per the desires of the user.

The system 400 may also include a secondary storage 410. The secondary storage 410 includes, for example, a hard disk drive and/or a removable storage drive, representing a floppy disk drive, a magnetic tape drive, a compact disk drive, digital versatile disk (DVD) drive, recording device, universal serial bus (USB) flash memory. The removable storage drive reads from and/or writes to a removable storage unit in a well-known manner.

Computer programs, or computer control logic algorithms, may be stored in the main memory 404 and/or the secondary storage 410. Such computer programs, when executed, enable the system 400 to perform various functions. Memory 404, storage 410 and/or any other storage are possible examples of computer-readable media.

In one embodiment, the architecture and/or functionality of the various previous figures may be implemented in the context of the central processor 401, graphics processor 406, an integrated circuit (not shown) that is capable of at least a portion of the capabilities of both the central processor 401 and the graphics processor 406, a chipset (i.e., a group of integrated circuits designed to work and sold as a unit for performing related functions, etc.), and/or any other integrated circuit for that matter.

Still yet, the architecture and/or functionality of the various previous figures may be implemented in the context of a general computer system, a circuit board system, a game console system dedicated for entertainment purposes, an application-specific system, and/or any other desired system. For example, the system 400 may take the form of a desktop computer, laptop computer, server, workstation, game consoles, embedded system, and/or any other type of logic. Still yet, the system 400 may take the form of various other devices including, but not limited to a personal digital assistant (PDA) device, a mobile phone device, a television, etc.

Further, while not shown, the system 400 may be coupled to a network (e.g., a telecommunications network, local area network (LAN), wireless network, wide area network (WAN) such as the Internet, peer-to-peer network, cable network, or the like) for communication purposes.

While various embodiments have been described above, it should be understood that they have been presented by way of example only, and not limitation. Thus, the breadth and scope of a preferred embodiment should not be limited by any of the above-described exemplary embodiments, but should be defined only in accordance with the following claims and their equivalents.

What is claimed is:

1. A method, comprising:
   receiving a command line input at a command line interface, wherein the command line input includes at least one of an assumption and an expression corresponding to a test condition;
   translating the command line input into one or more test conditions, wherein based on at least one signal, an assumption specified by the command line input is translated into a command that, when executed, verifies a first test condition corresponding to the assumption; and
   generating a test environment configured to simulate a circuit representation and verify the one or more test conditions.

2. The method of claim 1, further comprising:
   generating a representation of additional logic specified by the command line input; and
   including the representation in the test environment.

3. The method of claim 1, further comprising:
generating a representation of a logic declaration specified by the command line input; and
including the representation in the test environment.

4. The method of claim 3, wherein the representation is a representation of at least one of a register and a counter.

5. The method of claim 1, wherein, a second expression specified by the command line input is translated into a second command that, when executed, verifies a second test condition corresponding to the second expression.

6. The method of claim 5, wherein the circuit representation passes testing when the second test condition is always met during simulation of the circuit representation.

7. The method of claim 5, wherein the circuit representation passes testing when the second test condition is never net during simulation of the circuit representation.

8. The method of claim 5, wherein the circuit representation passes testing when the second test condition is met at least once during simulation of the circuit representation.

9. The method of claim 1, wherein a second expression specified by the command line input is translated into a second command that, when executed, allows at least one output signal or one input signal to have an unknown value during simulation of the circuit representation.

10. The method of claim 1, wherein a second expression specified by the command line input is translated into a second command that, when executed, requires one or more output signals to have known values during simulation of the circuit representation.

11. The method of claim 1, further, comprising:
simulating the circuit representation within the test environment; and
displaying one or more signal traces produced during simulation of the circuit representation in a waveform viewer when the first test condition is met.

12. A non-transitory computer-readable storage medium storing instructions that, when executed by a processor, cause the processor to perform steps comprising:
receiving a command line input at a command line interface, wherein the command line input includes at least one of an assumption and an expression corresponding to a test condition;
translating the command line input into one or more test conditions, wherein, based on at least one signal, an assumption specified by the command line input is translated into a command that, when executed, verifies a first test condition corresponding to the assumption; and
generating a test environment configured to simulate a circuit representation and verify the one or more test conditions.

13. The non-transitory computer-readable storage medium of claim 12, the steps further comprising:
generating a representation of additional logic specified by the command line input; and
including the representation in the test environment.

14. The non-transitory computer-readable storage medium of claim 12, the steps further comprising:
generating a representation of a logic declaration specified by the command line input; and
including the representation in the test environment.

15. The non-transitory computer-readable storage medium of claim 12, wherein, based on at least one signal, a second expression specified by the command line input is translated into a second command that, when executed, verifies a second test condition corresponding to the second expression.

16. The non-transitory computer-readable storage medium of claim 12, wherein a second expression specified by the command line input is translated into a second command that, when executed, allows at least one input signal or one output signal to have an unknown value during simulation of the circuit representation.

17. A system for testing a circuit representation, the system comprising:
a memory configured to store program instructions and the circuit representation; and
a processor configured to:
receive a command line input at a command line interface, wherein the command line input includes at least one of an assumption and an expression corresponding to a test condition;
execute one or more of the program instructions to:
translate the command line input into one or more test conditions, wherein, based on at least one signal, an assumption specified by the command line input is translated into a command that, when executed, verifies a first test condition corresponding to the assumption; and
generate a test environment configured to simulate the circuit representation and verify the one or more test conditions.

18. The system of claim 17, wherein the processor is further configured to:
generate a representation of additional logic specified by the command line input; and
include the representation in the test environment.

19. The system of claim 17, wherein the processor is further configured to:
generate a representation of a logic declaration specified by the command line input; and
include the representation in the test environment.

20. A method, comprising:
receiving a command line input at a command line interface, wherein the command line input includes at least one of an assumption and an expression corresponding to a test condition;
translating the command line input into one or more test conditions, wherein an expression specified by the command line input is translated into a command that, when executed, allows at least one input signal or one output signal to have an unknown value during simulation of the circuit representation; and
generating a test environment configured to simulate a circuit representation and verify the one or more test conditions.

* * * * *